United States Patent
Bandi et al.

(10) Patent No.: US 10,361,705 B2
(45) Date of Patent: Jul. 23, 2019

(54) STROBE CENTERING APPARATUS AND METHOD

(71) Applicant: Intel Corporation, Santa Clara, CA (US)

(72) Inventors: Chenchu Punnarao Bandi, Bangalore (IN); Amit Kumar Srivastava, Folsom, CA (US); Navindra Navaratnam, Ipoh (MY)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/006,686

(22) Filed: Jun. 12, 2018

(65) Prior Publication Data

US 2019/0007054 A1    Jan. 3, 2019

Related U.S. Application Data

(60) Provisional application No. 62/526,206, filed on Jun. 28, 2017.

(51) Int. Cl.
| | |
|---|---|
| *G06F 1/10* | (2006.01) |
| *H03L 7/00* | (2006.01) |
| *H03L 7/081* | (2006.01) |
| *H03K 3/84* | (2006.01) |
| *G06F 1/12* | (2006.01) |

(52) U.S. Cl.
CPC ............ *H03L 7/00* (2013.01); *G06F 1/10* (2013.01); *G06F 1/12* (2013.01); *H03K 3/84* (2013.01); *H03L 7/0818* (2013.01)

(58) Field of Classification Search
CPC .... G06F 1/10; G06F 1/12; H03K 3/84; H03L 7/00; H03L 7/0818
USPC .............. 326/93; 327/141, 144, 146, 155; 365/193, 220
See application file for complete search history.

(56) References Cited

U.S. PATENT DOCUMENTS

| | | | | |
|---|---|---|---|---|
| 6,977,539 B1* | 12/2005 | McDonagh | ............... | G06F 1/06 327/237 |
| 2008/0022145 A1* | 1/2008 | Murtagh | ............... | G06F 13/161 713/503 |

* cited by examiner

*Primary Examiner* — William Hernandez
(74) *Attorney, Agent, or Firm* — Green, Howard & Mughal LLP

(57) ABSTRACT

An apparatus is provided which comprises: a receiver to receive a differential clock; a delay locked loop (DLL) coupled to the receiver; a first phase interpolator (PI) coupled to the DLL, the first PI to provide a first clock phase; a second PI coupled to the DLL, wherein the second PI is to provide a second or third clock phase; circuitry to adjust the first and second PIs according to the first clock phase, and the second or third clock phase.

20 Claims, 10 Drawing Sheets

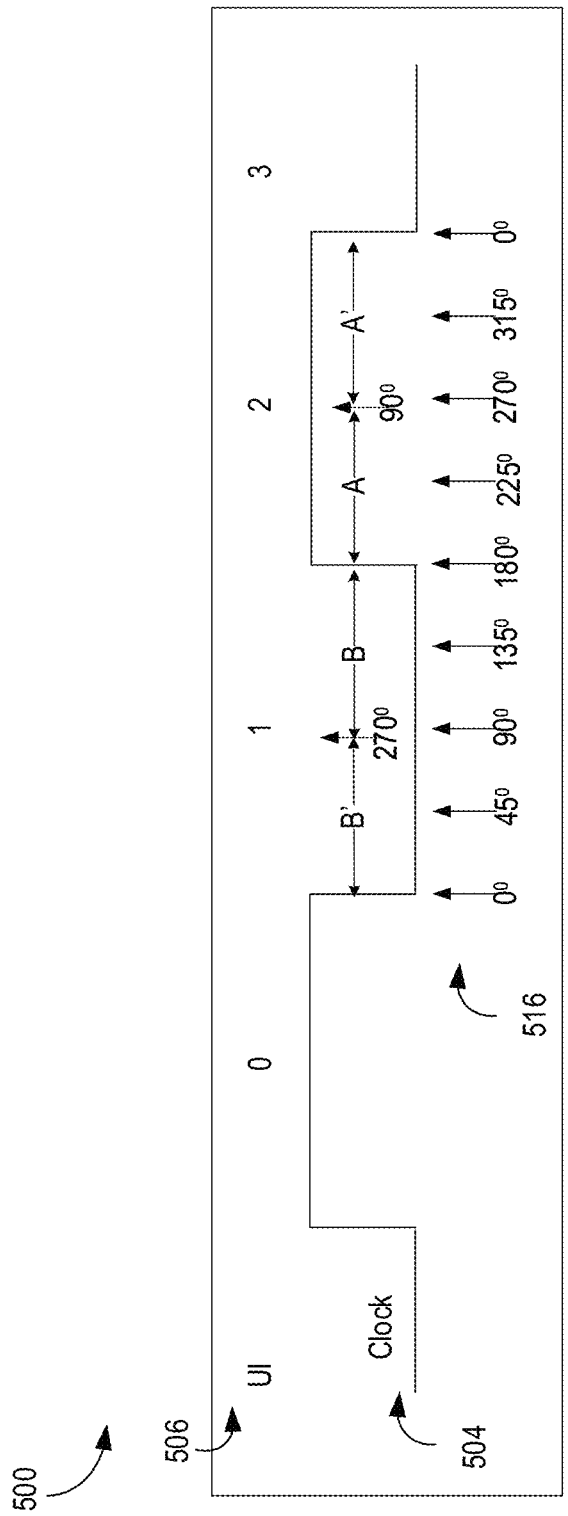

STROBE CENTERING APPARATUS AND METHOD

CLAIM OF PRIORITY

The present application claims priority under 35 U.S.C. § 119(e) to U.S. Provisional Patent Application Ser. No. 62/526,206, filed Jun. 28, 2017 and entitled "STROBE CENTERING APPARATUS AND METHOD," which is herein incorporated by reference in its entirety.

BACKGROUND

Multi-Lane source synchronous data links like DDR (Double Data Rate), eMMC (embedded Multi-Media Controller), MIPI D-PHY etc. launch data and clock/strobe signals synchronously from the transmitting end. At the receiving end, however, clock/strobe need to maintain the multiples of 0.5*UI (unit interval) to all data lanes in order to sample received data properly.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 5 illustrates a plot showing even/odd data eye width margining, according to some embodiments.

DETAILED DESCRIPTION

Figure 1:
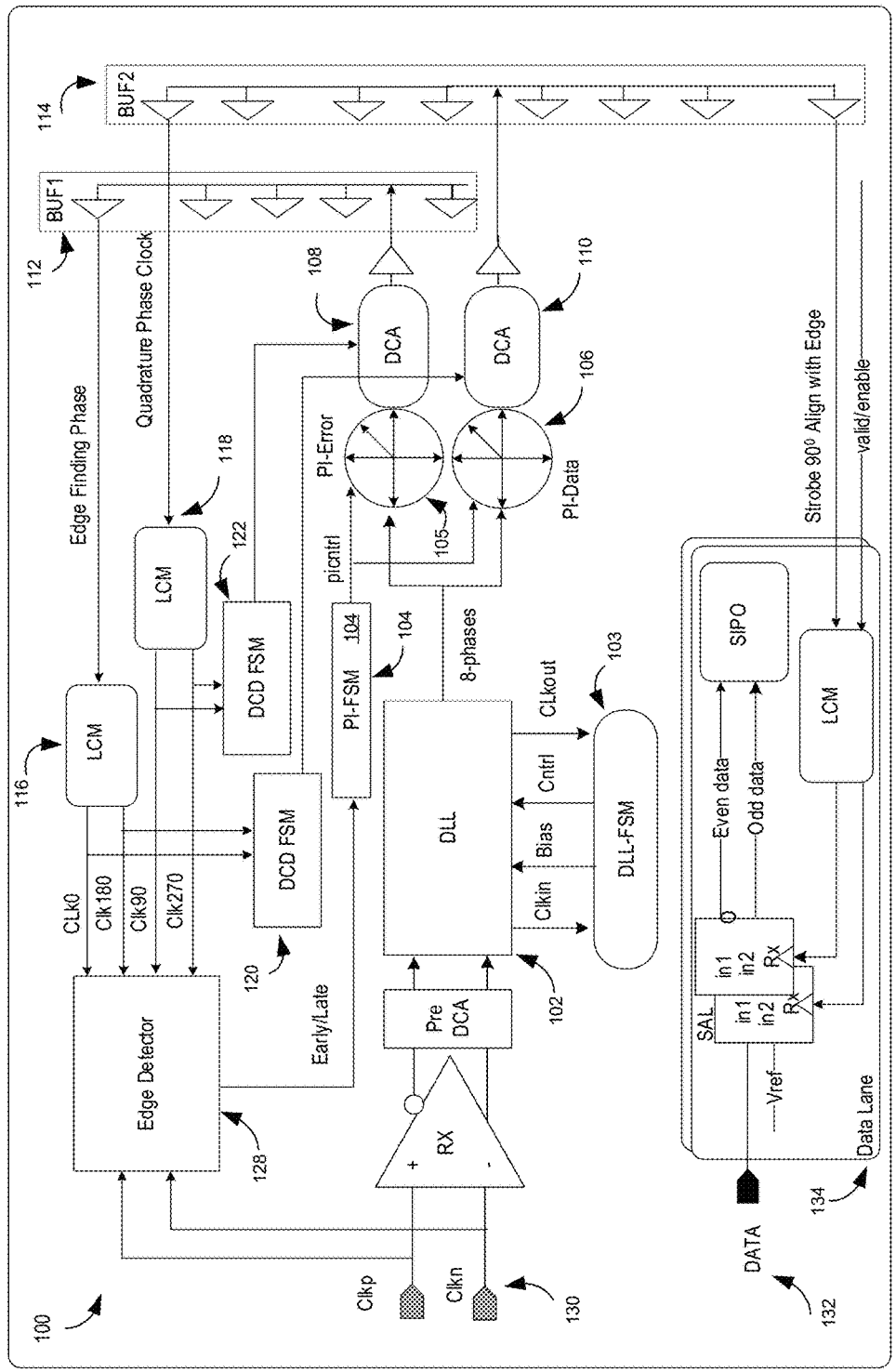
FIG. 1 illustrates a high level receiver architecture for a parallel link.

Here is the list of abbreviations for various terms in the description and figures. DDR: Double Data Rate; FSM: Finite State Machine; DCD: Duty Cycle Distortion; DCA: Duty Cycle Adjustor; UI: Unit Interval which is half cycle time of clock frequency that DLL is working; DLL: Delay Locked Loop; PD: Phase Detector; OFS: Offset; PI: Phase Interpolator; Tx: Transmitter; RX: Receiver; SAL: Strong Arm Latch; Vref: Voltage Reference to the $2^{nd}$ input for differential RX; LCM: Local Clock Macro that generates in-phase and out-phase clock for input clock; SIPO: Serial Input Parallel Output; Clkfb/FB: Feedback Clock; and Clkref/REF: Reference Clock.

Some embodiments describe a strobe centering circuit technique which limits the minimum delay (min-delay) to less than 2UI and may not use any DCD correction or LCM clock generation. Some embodiments also use an additional buffer chain (e.g., also known as clock distribution network) which is controlled by a PI offset logic to generate additional phases for RX data sampling. Some embodiments also provide a real-time on-die calibration technique to minimize or reduce skew between two clock trees, which assists in removing duty cycle correction block. Some embodiments use a PI finite state machine which provides the correct setting to generate and control a Voltage and Temperature (VT) tracking clock.

There are many technical effects of various embodiments. For example, the strobe centering circuit technique results in robust and faster convergence calibration mechanism, the strobe centering circuit technique may not need software margin, the strobe centering circuit technique reduces min-delay significantly, to lock sampling edge within 2 UI which translates to nearly 45% of delay saving, the strobe centering circuit technique may not need any expensive solution like low noise on-Die Regulator designs, the strobe centering circuit technique may not need any global or per-lane duty cycle detection mechanisms which assists in saving area and active power, the strobe centering circuit technique results in significant reduction in link boot time as there is no need of LCM and DCA calibration, the strobe centering circuit technique provides independent even/odd data widths margining capability and able to provide the corrective offset accordingly, the strobe centering circuit technique saves power (e.g., nearly 10 mW of active power saving due to removal of clock tree and removal of DCA/LCM). Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function.

The term "signal" may refer to at least one current signal, optical signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For the purposes of present disclosure the terms "spin" and "magnetic moment" are used equivalently. More rigorously, the direction of the spin is opposite to that of the magnetic moment, and the charge of the particle is negative (such as in the case of electron).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiC-MOS, CMOS, etc., may be used without departing from the scope of the disclosure.

FIG. 1 illustrates a high level receiver architecture 100 for a parallel link. One of the prior art implementations of Receiver Architecture uses the Receiver strobe placement based on DLL (102), DLL-FSM (103), PI-FSM (104), PI-Error (105), PI-Data (106), DCAs (108, 110), BUF1/BUF2 clock trees (112, 114), LCMs (116, 118), DCD FSMs (120, 122), Edge Detector (128), and Data Lane circuitry (134), where the FSM is a Finite State Machine; DCD is a Duty Cycle Distortion logic; DCA is a Duty Cycle Adjustor; DLL is a Delay Locked Loop; PI is a Phase Interpolator; and LCM is a Local Clock Macro that generates in-phase and out-phase clock for input clock. A Phase Interpolator (PI) allows the receiver to adjust the phase of its sampling clocks in very fine increments. The Edge detector (128) generates early/late indication based on comparison of received differential strobe/clock clkp, clkn 130 and LCMs (116, 118) output clock phases Clk0, Clk90, Clk180, and Clk270, received from BUF1/BUF2 clock trees (112, 114) controlled by PI-Error (105) and PI-Data (106). The PI-FSM (104) uses Early/late indication provided by the Edge detector (128) to find correct clock by controlling PI output which are 90° phase offset and used by Data lane receiver (134) to sample Data (132). The buffer clock trees (e.g., BUF1, BUF2) are also known as clock distribution networks. The clock distribution networks (or clock tree) distribute the clock signal(s) from a common point to all the elements that need it. The Local Clock Macros (LCMs) 116, 118 are used to generate complimentary clock phases (Clk0, Clk90, Clk180, and Clk270) which are input to the Edge detector 128. The Data Lane circuitry (134) includes the Strong ARM Latch (SAL) for sampling input Data based on the LCM clock outputs to generate even and odd data samples which are coupled to the SIPO circuitry. The SIPO circuitry allows conversion of data from serial to parallel format. The prior architecture includes similar Data Lane circuitry for sampling input Data corresponding to other Data lanes in the parallel link. Prior Architecture suffers from various challenges for the link operating at 8 GTS (Giga Transfers Per Second) or beyond. These challenges include larger min-delay, higher deterministic jitter, and duty cycle constraints.

Here, min-delay is the minimum delay of the strobe signal which is used by the data phase detector to sample, and is defined as: $td_{min} = t_{RXmin} + t_{PreDCAmin} + t_{DLLmin} + t_{PImin} + t_{DCAmin} + t_{BUF2min} + t_{LCMmin}$; where $td_{min}$ is nearly 500 ps or 4 UI for the link operating at 8 GTS, where nearly 45% of delay contribution alone comes from duty cycle adjustment and LCM only. $t_{RXmin}$ represents the receiver RX path minimum delay, $t_{PreDCAmin}$ represents the Pre DCA minimum delay, $t_{DLLmin}$ represents the DLL logic minimum delay, $t_{PImin}$ represents the PI logic minimum delay, $t_{DCAmin}$ represents the DCA logic minimum delay, $t_{BUF2min}$ represents the BUF2 (114) logic minimum delay, and the $t_{LCMmin}$ represents the LCM logic minimum delay.

Table 1 summarizes the negative margin due to architecture 100 for an example link operating at 8 GTS. Higher deterministic jitter is caused by larger min-delay of 4UI which causes deterministic jitter to worsen the link budget. As shown in Table 1 nearly 14 ps eye-margin loss (approximately 11% of the total UI) is due to the 4UI min-delay path.

TABLE 1

| Slow Corner at 1.05 V at 8 GTS | Jitter (ps) |
| --- | --- |
| Power supply noise | 30 |
| Data/Clock skew | 4.5 UI |
| Channel Noise | 35 |
| ISI, Xtalk | 75.3 |
| Min Eye-margin | 28 |
| Margin Left | −13.3 |

A data link operating at 1UI=125 p Sec or beyond may require per lane duty cycle correction within approx. 1 ps of accuracy. This requirement makes LCM design more complicated and power inefficient resulting in duty cycle constraints. Even with very clean voltage regulators (e.g., less than ±10 mV noise), design constraints may not be met with architecture 100.

Various embodiments address challenges described here and provide a new strobe centering circuit technique, which helps in limiting min-delay to be less than 2UI by removing LCM and DCA in the clock path and rely on positive edge sampling. Some embodiments also use additional BUF (buffer) chain (e.g., also known as clock distribution network) which is controlled by a PI offset logic to generate the additional clock phases for RX data lane resulting in no DCD compensation mechanism in the receiving path as compared to FIG. 1. Some embodiments use a PI finite state machine which provides the correct setting to generate and control the Voltage and Temperature (VT) tracking clock.

Figure 2:
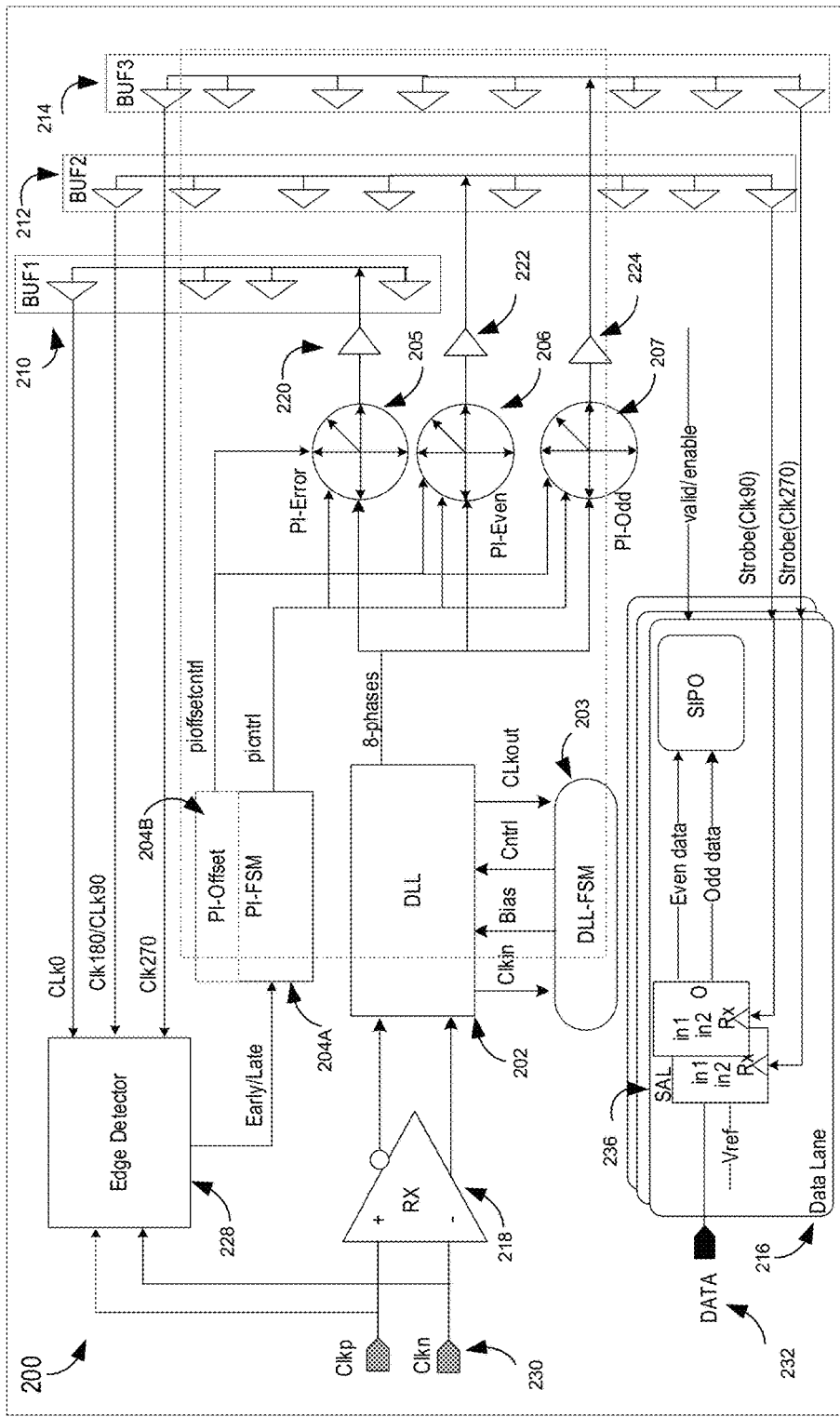
FIG. 2 illustrates a high level architecture for strobe centering, according to some embodiments.

FIG. 2 illustrates a high level architecture 200 for strobe centering, according to some embodiments. It is pointed out that those elements of FIG. 2 having the same reference numbers (or names) as the elements of any other figure can operate or function in any manner similar to that described, but are not limited to such. Architecture 200 comprises DLL (202), DLL-FSM (203), PI-FSM (204A), PI-OFFSET (204B), PI-Error (205), PI-Even (206), PI-Odd (207), BUF1/BUF2/BUF3 clock trees (210, 212, 214), Data Lane circuitry (216), buffers (218, 220, 222, 224), and Edge Detector (228), where the FSM is a Finite State Machine; DLL is a Delay Locked Loop; and PI is a Phase Interpolator. The PI-Error output during training phase, is equivalent to the phase 0° of DLL, which could be used for measuring error. Therefore, the PI-Error is considered as an error Phase Interpolator, or an error PI. The PI-Even and PI-Odd outputs during functional/operational phase, are used to sample the even data and odd data respectively. Therefore, the PI-Even is considered as an even Phase Interpolator, or even PI, and PI-Odd is considered as an odd Phase Interpolator, or an odd PI. The Data Lane circuitry (216) includes the SAL (236) for sampling input Data based on Strobe (Clk90) and Strobe (Clk270) to generate Even and Odd data samples which are coupled to the SIPO circuitry. The SIPO circuitry allows conversion of data from serial to parallel format. The architecture 200 includes similar Data Lane circuitry for sampling input Data corresponding to other Data lanes in the parallel link.

In some embodiments, BUF1/BUF2/BUF3 are clock trees used for edge Finding and Voltage and Temperature (VT) tracking and also used for RX data sampling. In some embodiments, PI-FSM (204A) is the finite state machine which provides the correct setting to generate and control the VT tracking clock. In some embodiments, PI-OFFSET is a sub-set of PI-FSM which helps in finding the skew between BUF2 and BUF3 clock phase trees which is also used for data (e.g., even/odd sampling for RX data separately) sampling receivers. Some embodiments describe an initial-centering mode scheme, skew correction scheme, Voltage and Temperature (VT) correction mode scheme.

Figure 3A:
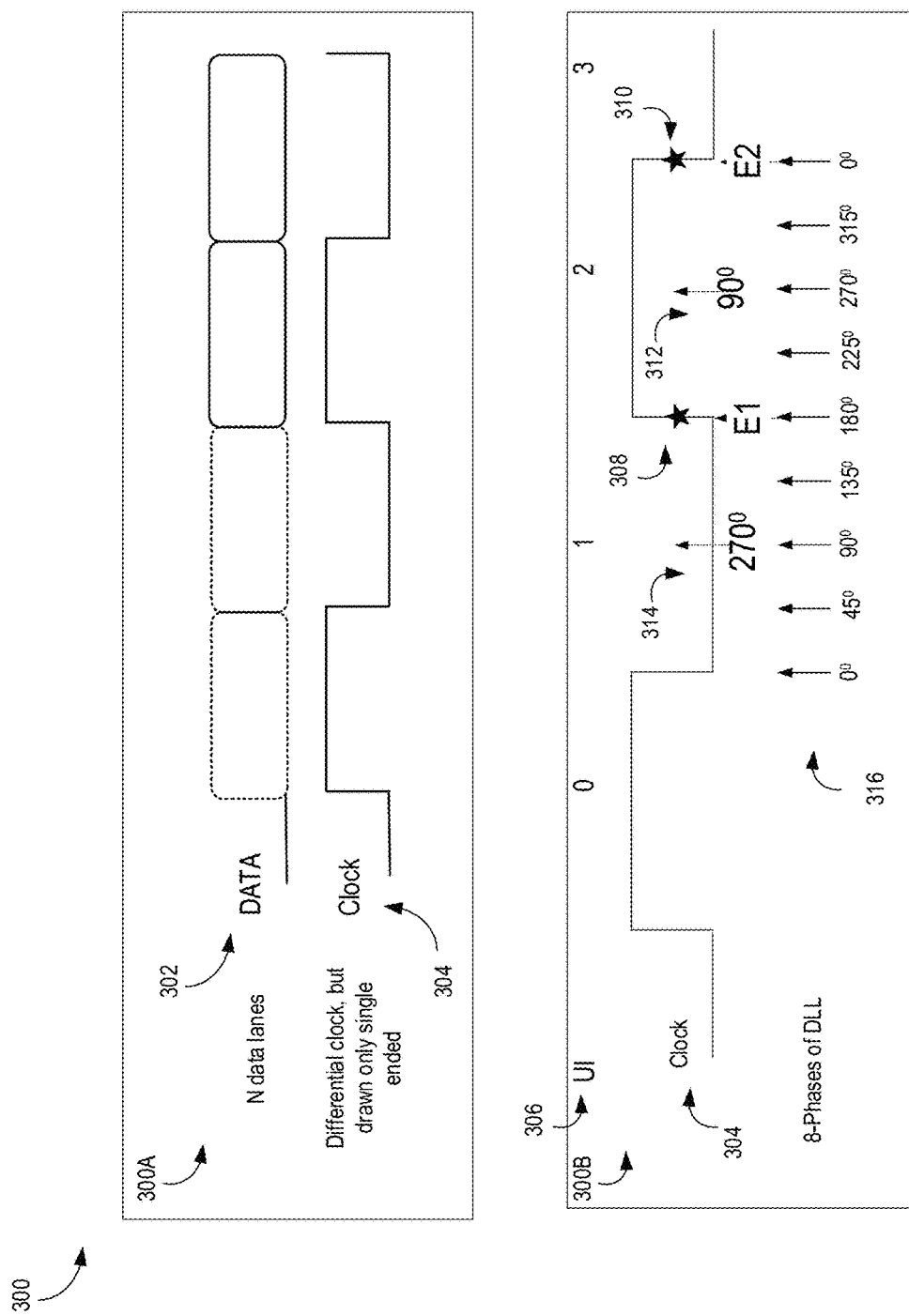
FIG. 3A illustrates plots showing timing diagrams of a calibration scheme for initial centering during training phase, according to some embodiments.

FIG. 3A illustrates plots 300A and 300B showing timing diagrams of a calibration scheme for initial centering during training phase, according to some embodiments.

Plot 300A illustrates a timing diagram of a received Data (302) and strobe/clock (304) which represents the differential clock Clkn, Clkp (230) drawn only single ended, according to some embodiments. The parallel Data lanes (302) correspond to data lanes (232), which are synchronous. This would be guaranteed by the package design of the transmitter and receiver logic functions. In some embodiments, the number of data lanes are N, where N is an even number and larger than 2. The strobe and data lanes are edge aligned (e.g., synchronized).

Plot 300B illustrates a timing diagram of strobe/clock (304) which represents the differential clock (Clkn, Clkp) drawn only single ended, according to some embodiments. UI (306) represents Unit Interval which is half cycle time of the clock frequency.

In some embodiments, during training phase, calibration logic selects BUF1 clock tree (210) for edge sampling of the clock which is equivalent to the phase 0° of DLL by PI-Error (205), which has the min-delay and recorded at the output of edge sample, referred to as E1 (308).

In some embodiments, during training phase, calibration logic selects BUF2 clock tree (212) with 180° phase offset from BUF1 clock tree phase by using PI-Even (206) to sample the other edge of the clock tree and recorded at the output samples, which is here referred to as E2 (310). In some embodiments the calibration logic includes one or more of: the PI-FSM, DLL-FSM, PI-OFFSET. The phases (316) represent the 8 phases of DLL with respect to the E2 point of phase reference.

In some embodiments, based on the sampled outcomes 'E1' and 'E2', calibration logic controls PI_Error (205) and PI Even (206) to rotate the clocks and find the transition 0→for E1 and 1→0 for E2 or vice-versa. By averaging of E1 and E2 codes, PI is able to determine 90° clock phase (312) by (E1+0.5*(E1+E2)) and 270° clock phase (314) by (E1−0.5*(E1+E2)). In some examples, these are the ideal phases to sample the even and the odd data.

Figure 3B:
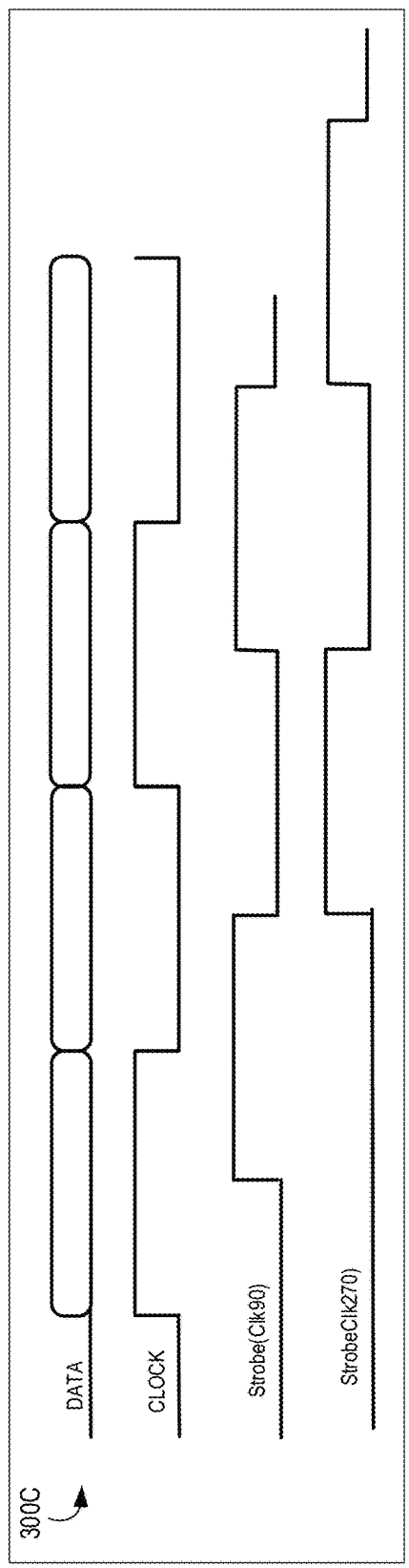
FIG. 3B illustrates plot showing timing diagrams of a calibration scheme for initial centering during functional/operational phase, according to some embodiments.

FIG. 3B illustrates plot 300C showing timing diagrams of a calibration scheme for initial centering during functional/operational phase, according to some embodiments.

In some embodiments, during operation/functional phase, the PI-FSM logic to set the PI-Even to the 90° clock phase and to set PI-Odd output to 270° clock phase obtained during training phase, and to drive the Strobe (Clk90) and Strobe (Clk270) through BUF2 and BUF3. The Strobe (Clk90) and Strobe (Clk270) to sample even data and odd data through SAL (236) respectively.

Plot 300C illustrates a timing diagram of Strobe (Clk90) and Strobe (Clk270) sampling even data and odd data through SAL (236) respectively. Strobe/clock (304) represents the differential clock (Clkn, Clkp) 230 drawn only single ended. The parallel Data lanes (302) correspond to data lanes (232), which are synchronous.

In some embodiments, if during training phase, min-delay time E1 sample has no outcome, the calibration logic rotates the PI phase by 360°, and reverse sweeps to find the rising edge of the clock of next cycle UI. In this case, the edge finding is limited to rising edge only for quick algorithm convergence.

Figure 4:
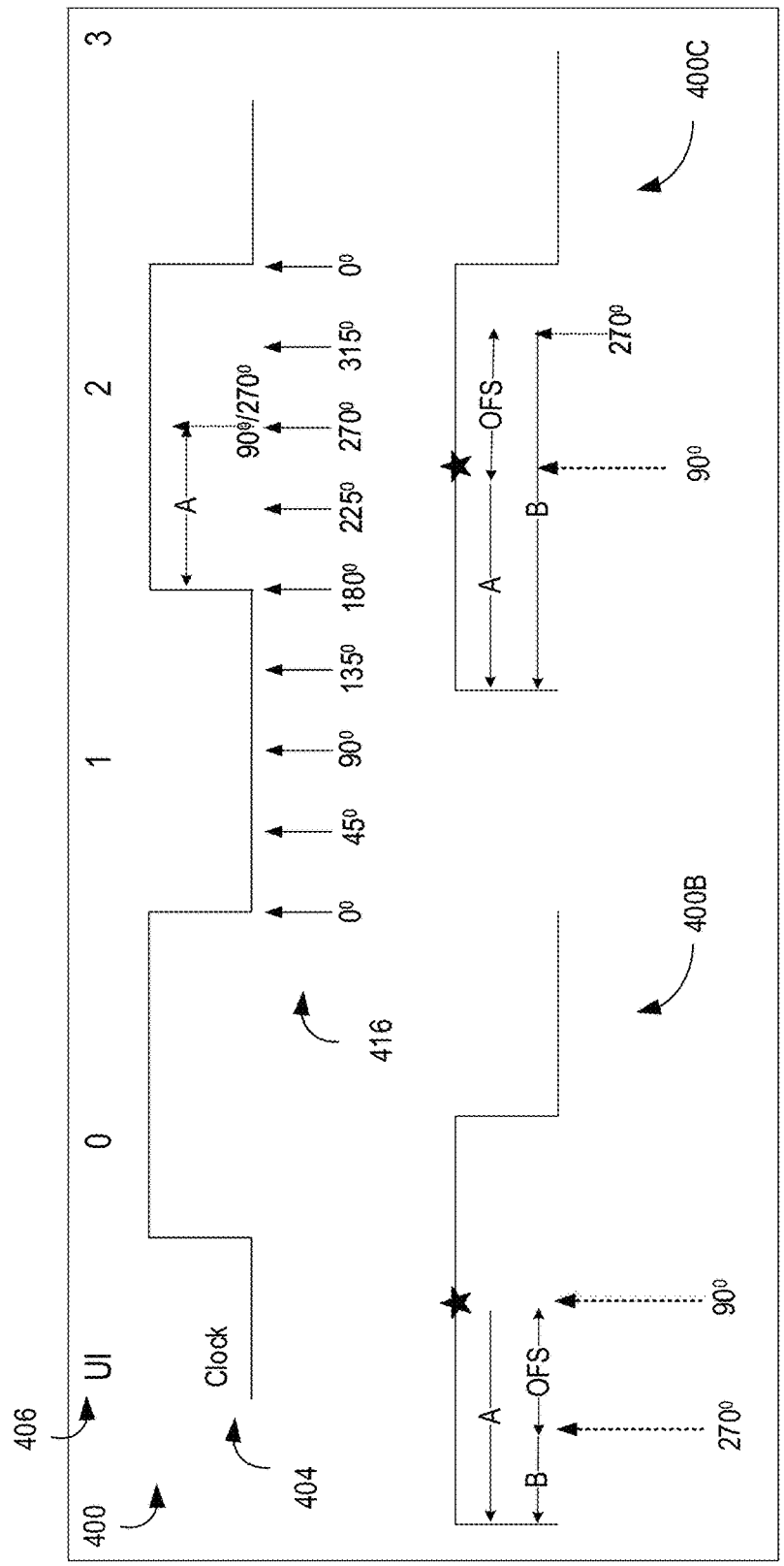
FIG. 4 illustrates a plot showing a skew estimation and correcting scheme, according to some embodiments.

FIG. 4 illustrates plot 400 showing a skew estimation and correcting scheme, according to some embodiments. Plot 400 shows timing diagram of strobe/clock (404) which represents the differential clock (Clkn, Clkp) 230 drawn only single ended, according to some embodiments. UI (406) represents Unit Interval which is half cycle time of the clock frequency.

In some embodiments, a separate clock tree (BUF3) is used as 270° clock phase from the clock to sample the odd data. This BUF3 may inherit skew as opposed to BUF2 which is tracked/compensated with incoming strobe. Some embodiments correct the skew between BUF2 and BUF3. For example, skew between BUF2 and BUF3 is controlled by PI-Offset logic by controlling PI-Odd. The phases (416) represent the 8 phases of DLL with respect to the falling clock edge.

In some embodiments, after finding the edge, the 90° phase edge at distance A is identified. In some embodiments, edges are swept through PI-Even of BUF2 to find the transition from one to zero, and then the code value E3 is stored.

In some embodiments, similarly for BUF3, PI shifts the code by 180 degree (e.g., 90° in phase difference with clock rising edge) so that BUF3 will be at the center with some skew. In some embodiments, the code for BUF3 is then swept and the 1→0 transition is determined, and then the code value E4 is stored.

In some embodiments, a difference between code E3 and code E4 is determined to give indication of skew between BUF2 and BUF3 clock trees. In some embodiments, PI-Offset logic uses this E3 and E4 code difference to adjust the BUF3 Clock and shift left or right to compensate for the skew. Plot 400B shows a timing diagram of BUF2 when the BUF3 clock skew is lagging. The 90° phase edge is located at distance A. The 270° phase edge of BUF 3 is located at distance B which is smaller than A, and the offset is represented by OFS. The PI-Offset logic uses the offset "OFS" to adjust the BUF3 Clock and shift right. Plot 400C shows a timing diagram of BUF2 when the BUF3 clock skew is leading. The 90° phase edge is located at distance A. The 270° phase edge of BUF 3 is located at distance B which is larger than A, and the offset is represented by OFS. The PI-Offset logic uses the offset "OFS" to adjust the BUF3 Clock and shift left.

In some embodiments, to optimize calibration time, the sweep through PI-Even of BUF2 to find E3, and the sweep code for BUF3 to find E4, starts with coarse steps and later converges using fine steps. In some embodiments, the sweeping starts from the left to right (i.e. earlier phase to later phase), and in some embodiments the sweeping starts from right to left (i.e. later phase to earlier phase) and the edge transition from 1→0 is determined and similarly skew is found.

FIG. 5 illustrates plot 500 showing even/odd data eye width margining, according to some embodiments. In some embodiments, the scheme can be extended to determine even and odd data width margining after extracting and adjusting the offset for the skew between the two clock trees (BUF2 and BUF3) for the case that the incoming strobe (504) is not 50% Duty Cycle Distortion (DCD) for data proxy as shown in the FIG. 5. The 270° phase could be in the next UI in some cases. The phases (516) represent the 8 phases of a DLL with respect to the falling clock edge. UI (506) represents Unit Interval which is half cycle time of the clock frequency.

In some embodiments, after finding the incoming strobe edges, using BUF1 and BUF2 clock trees, and PI-FSM using PI-Error and PI-Even, the 90° phase edge on BUF2 at distance A is identified by using PI-Even (206), and 180° phase offset from BUF2 clock tree phase on BUF3 clock tree (214) is identified at distance B by using PI-Odd (207). After finding the other edge of the clock tree, the 90° phase edge at distance A' and the 180° phase edge at a distance B' are identified. The difference between (A+A')−(B+B') distances is the DCD error since (A+A')+(B+B') is equal to 1 cycle. In the case that DCD is 50% then (A+A')=(B+B').

In some embodiments, the tracked and or locked edge is caused by variations in Voltage or Temperature (VT). In some embodiments, the BUF1 clock tree which is matched with BUF2 & BUF3 sampling clock trees after skew correction between BUF2 & BUF3 is kept running in the background for tracking the rising edge shift due to VT shift.

In some embodiments, the difference is given directly to PI-Even BUF2 clock tree only in order to compensate for the VT shift. In some embodiments, the PI-FSM (204A) is the finite state machine which provides the correct setting to generate and control the VT tracking clock.

In some embodiments, the difference is given directly to PI-Even BUF2 clock tree and also to PI-Odd BUF3 clock tree in order to compensate for the VT shift. In some embodiments, the PI-FSM (204A) is the finite state machine which provides the correct setting to generate and control the VT tracking clock.

In some embodiments, the apparatus for automatic hardware calibration technique helps in saving significant post-silicon validation effort cost to improve margin for High Volume Manufacturing (HVM). In some embodiments, the automatic hardware calibration technique is a robust and faster digital calibration technique. In some embodiments, the architecture has no DCD adjustment in the strobe path. In some embodiments, the apparatus provides an area and power saving solution.

Figure 6A:
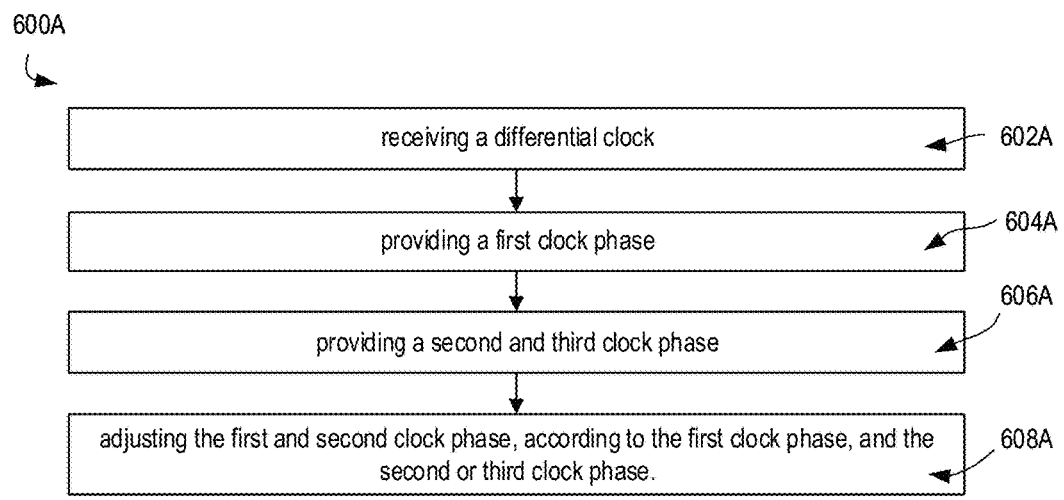
FIGS. 6A-C illustrate methods of adjusting clock phase, according to some embodiments.

FIG. 6A illustrates a flow diagram of a method of adjusting clock phase, in accordance with some embodiments.

Method 600A begins at operation 602A receiving a differential clock. In some embodiments the differential clock comprises of Clkn, Clkp (230). The next operation 604A comprises providing a first clock phase. In some embodiments, the first clock phase comprises of BUF1 clock tree (210) output, which is equivalent to the phase 0° of DLL by PI-Error (205). Operation 606A comprises providing a second and third clock phases. In some embodiments, the second phase comprises of BUF2 clock tree (212) output, which is equivalent to the phase 90°/180° of DLL by PI-Even (206). In some embodiments, the third clock phase comprises of BUF3 clock tree (214) output, which is equivalent to the phase 270° of DLL by PI-Odd (207). Method 600A completes at operation 608A adjusting the first and second clock phase, according to the first clock phase, and the second or third clock phase.

Figure 6B:
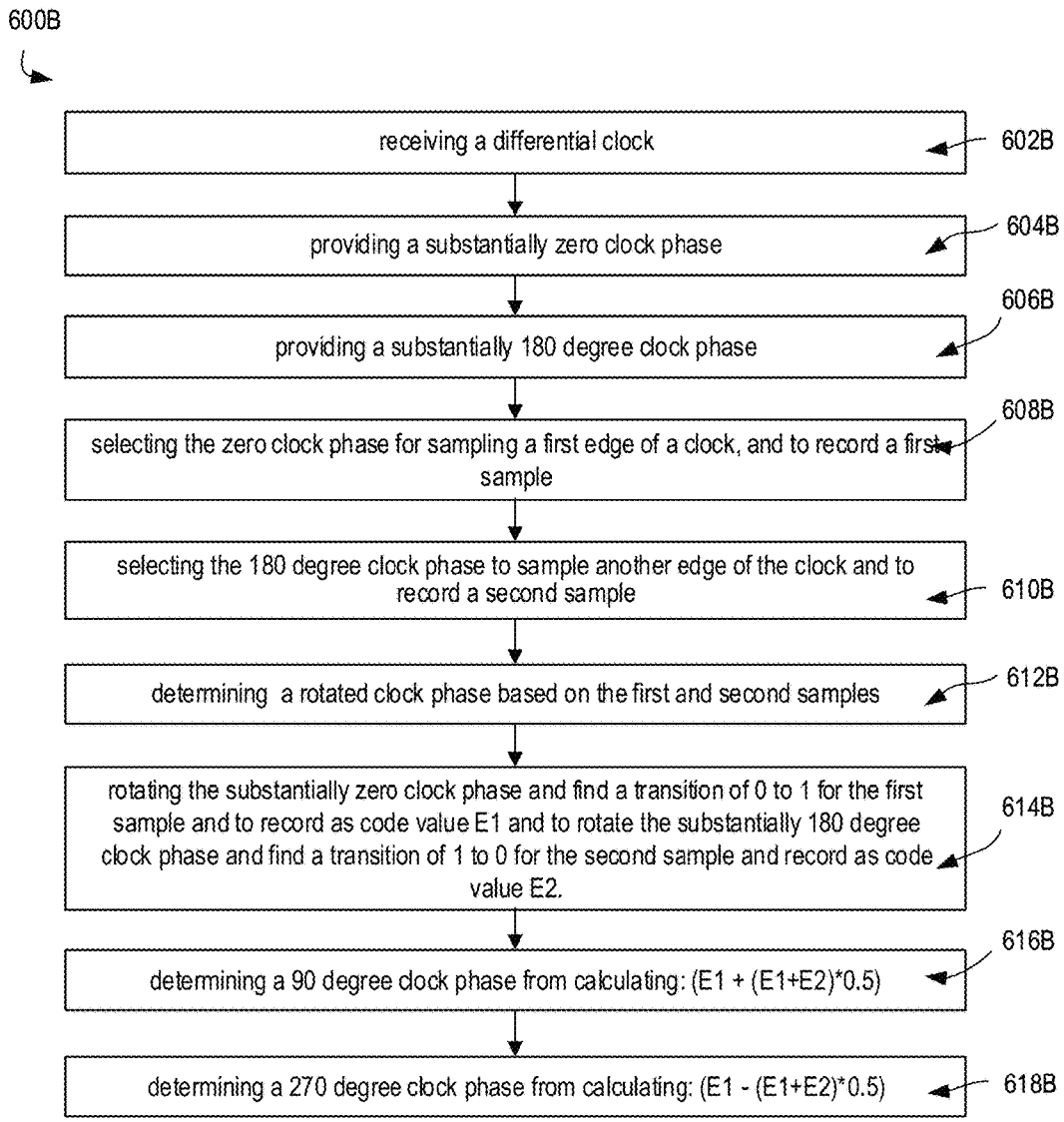

FIG. 6B illustrates a flow diagram of a method of determining a rotated clock phase, in accordance with some embodiments.

Method 600B begins at operation 602B receiving a differential clock. In some embodiments the differential clock comprises of Clkn, Clkp (230). The next operation 604B comprises providing a substantially zero clock phase. In some embodiments, the substantially zero clock phase is provided by BUF1 clock tree (210) output, which is equivalent to the phase 0° of DLL by PI-Error (205). Operation 606B comprises providing a substantially 180 degree clock phase. In some embodiments, the substantially 180 degree clock phase is provided by BUF2 clock tree (212) output, which is equivalent to the phase 180° of DLL by PI-Even (206). Operation 608B comprises selecting the zero clock phase for sampling a first edge of a clock, and to record a first sample. Operation 610B comprises selecting the 180 degree clock phase to sample another edge of the clock and to record a second sample. Operation 612B comprises determining a rotated clock phase based on the first and second samples. Operation 614B comprises rotating the substantially zero clock phase and find a transition of 0 to 1 for the first sample and to record as code value E1 and to rotate the substantially 180 degree clock phase and find a transition of 1 to 0 for the second sample and record as code value E2. Operation 616B comprises determining a 90 degree clock phase from calculating: (E1+(E1+E2)*0.5). Operation 618B comprises determining a 270 degree clock phase from calculating: (E1−(E1+E2)*0.5)

Figure 6C:
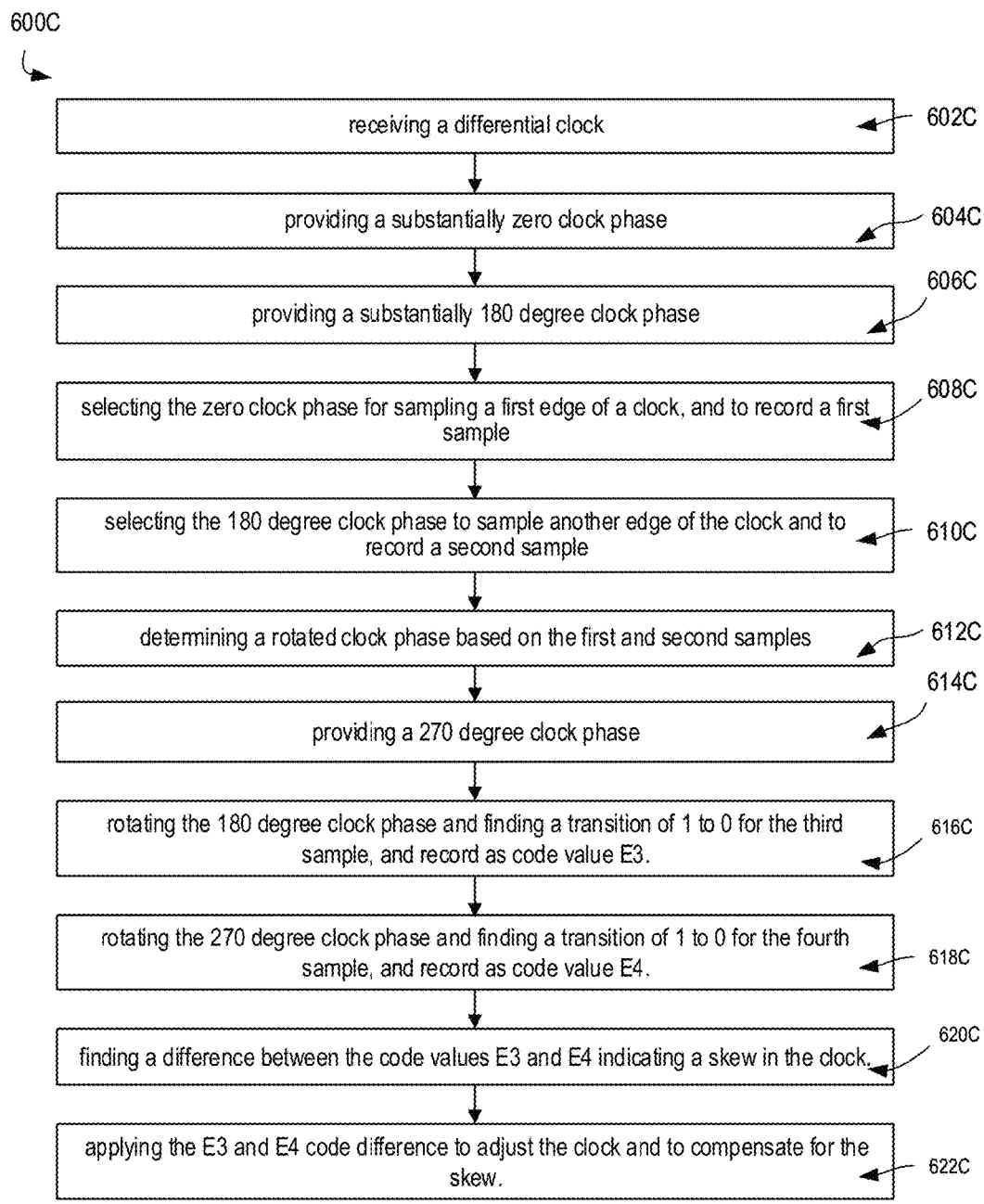

FIG. 6C illustrates a flow diagram of a method of determining a rotated clock phase, in accordance with some other embodiments.

Method 600C begins at operation 602C receiving a differential clock. In some embodiments the differential clock comprises of Clkn, Clkp (230). The next operation 604C comprises providing a substantially zero clock phase. In some embodiments, the substantially zero clock phase is provided by BUF1 clock tree (210) output, which is equivalent to the phase 0° of DLL by PI-Error (205). Operation 606C comprises providing a substantially 180 degree clock phase. In some embodiments, the substantially 180 degree clock phase is provided by BUF2 clock tree (212) output, which is equivalent to the phase 180° of DLL by PI-Even (206). Operation 608C comprises selecting the zero clock phase for sampling a first edge of a clock, and to record a first sample. Operation 610C comprises selecting the 180 degree clock phase to sample another edge of the clock and to record a second sample. Operation 612C comprises determining a rotated clock phase based on the first and second samples. Operation 614C comprises providing a 270 degree clock phase. In some embodiments, the 270 degree clock phase is provided by BUF3 clock tree (214) output, which is equivalent to the phase 270° of DLL by PI-Odd (207). Operation 616C comprises rotating the 180 degree clock phase and finding a transition of 1 to 0 for the third sample, and record as code value E3. Operation 618C comprises rotating the 270 degree clock phase and finding a transition of 1 to 0 for the fourth sample, and record as code value E4. Operation 620C comprises finding a difference between the code values E3 and E4 indicating a skew in the clock. Operation 622C comprises applying the E3 and E4 code difference to adjust the clock and to compensate for the skew.

However, the above operations are not limited in this regard and, in various implementations, the above operations may include the undertaking of only a subset of such operations, undertaking a different order of such operations, undertaking a different combination of such operations, and/or undertaking additional operations than those operations explicitly listed.

Figure 7:
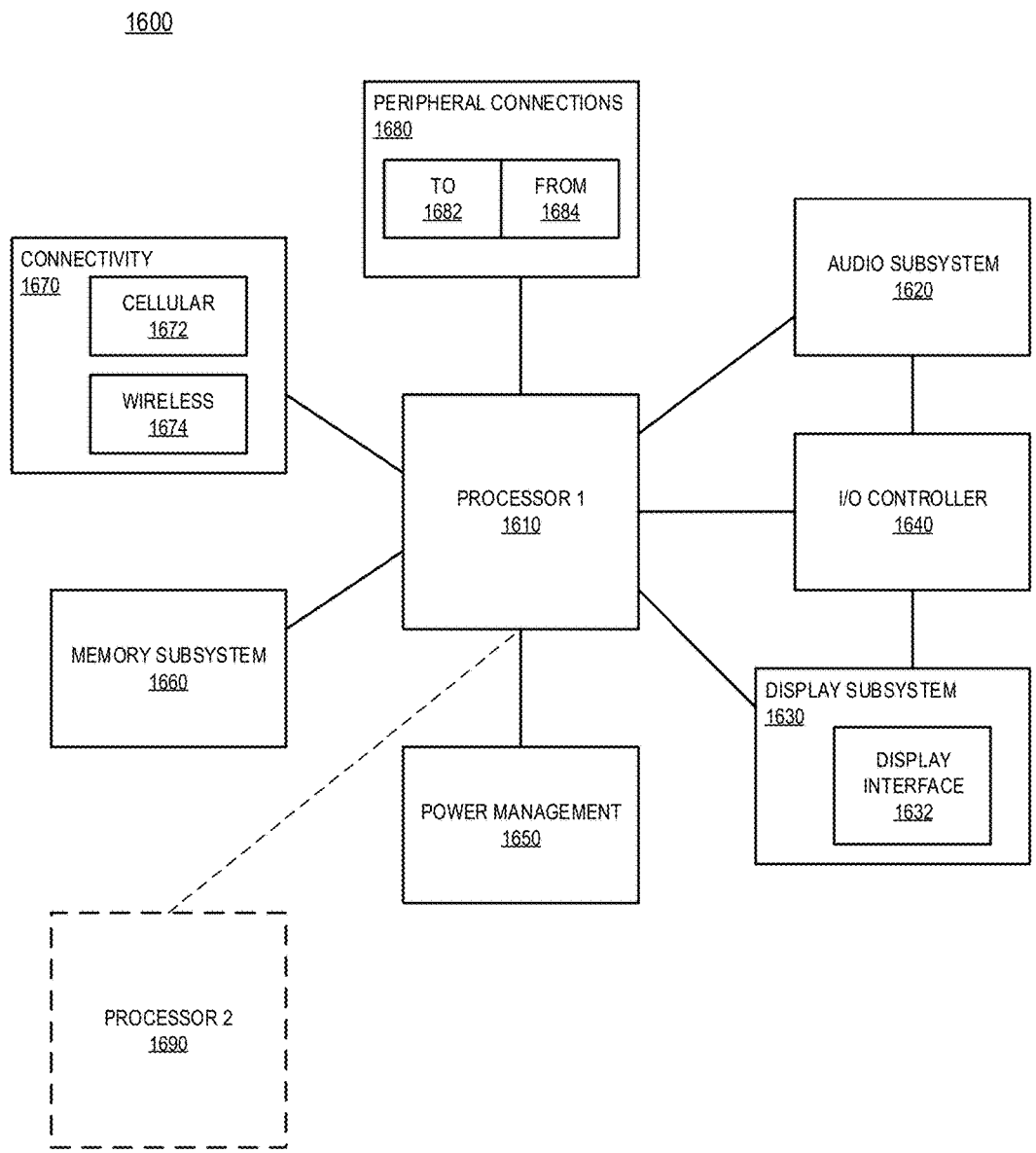
FIG. 7 illustrates a smart device or a computer system or a SoC (System-on-Chip) having apparatus for strobe centering, according to some embodiments of the disclosure.

FIG. 7 illustrates a smart device or a computer system or a SoC (System-on-Chip) having apparatus for strobe centering, according to some embodiments of the disclosure. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 having apparatus for strobe centering, according to some embodiments discussed. Other blocks of the computing device 1600 may also include apparatus for strobe centering, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

In one example, an apparatus is provided comprising: a receiver to receive a differential clock; a delay locked loop (DLL) coupled to the receiver; a first phase interpolator (PI) coupled to the DLL, the first PI to provide a first clock phase; a second PI coupled to the DLL, wherein the second PI is to provide a second or third clock phase; circuitry to adjust the first and second PIs according to the first clock phase, and the second or third clock phase.

Example 2

The apparatus of Example 1, wherein the first PI is an error PI, and wherein the second PI is an even PI.

Example 3

The apparatus of Examples 1-2, wherein the apparatus further comprises a third PI coupled to the DLL, wherein the third PI is to provide a fourth clock phase.

Example 4

The apparatus of Examples 1-3, wherein the third PI is an odd PI.

Example 5

The apparatus of Examples 1-4, wherein the first, second and third PI are coupled respectively to a first, second and third buffers, wherein the buffers are clock trees used for receiver data sampling.

Example 6

The apparatus of Examples 1-5, wherein the first, second and third PI are coupled to a PI Finite State Machine (PI-FSM), wherein the PI-FSM is to provide a setting to generate and control a Voltage/Temperature (VT) tracking clock.

Example 7

The apparatus of Examples 1-6, wherein the apparatus further comprises a first clock distribution network and a second clock distribution network, wherein the first distribution network is to receive the second clock phase, wherein the second distribution network is to receive a third clock phase, wherein the first, second and third PI are coupled to a second circuitry, wherein the second circuitry is to provide skew between first and second clock distribution networks.

Example 8

The apparatus of Examples 1-7, wherein the first, second, and third clock phases are at least one of: substantially 0, 90, and 270 degree clock phases, respectively; or substantially 0, 180, and 270 degree clock phases, respectively.

Example 9

In another example, an apparatus is provided comprising: a receiver to receive a differential clock; a delay locked loop (DLL) coupled to the receiver; a first phase interpolator (PI) coupled to the DLL, wherein the first PI is to provide a substantially zero clock phase; a second PI coupled to the DLL, wherein the second PI is to provide a substantially 180 degree clock phase; and a calibration logic to select the zero clock phase for sampling a first edge of a clock, and to record a first sample; wherein the calibration logic is to select the 180 degree clock phase to sample another edge of the clock and to record a second sample; and wherein the calibration logic is to determine a rotated clock phase based on the first and second samples.

Example 10

The apparatus of Example 9, wherein the calibration logic is to rotate the first PI clock phase and find a transition of 0 to 1 for the first sample and to record as code value E1 and to rotate the second PI clock phase and find a transition of 1 to 0 for the second sample and record as code value E2.

Example 11

The apparatus of Examples 9-10, wherein the calibration logic is to rotate the first PI clock phase and find a transition of 1 to 0 for the first sample and to record as code value E1 and to rotate the second PI clock phase and find a transition of 0 to 1 for the second sample and record as code value E2.

Example 12

The apparatus of Examples 9-11, wherein the calibration logic is to determine a 90 degree clock phase from calculating: (E1+(E1+E2)*0.5).

Example 13

The apparatus of Examples 9-12, wherein the calibration logic to determine a 270 degree clock phase from calculating: (E1−(E1+E2)*0.5).

Example 14

The apparatus of Examples 9-13, wherein the apparatus further comprises a third PI coupled to the DLL, wherein the third PI is to provide a 270 degree clock phase.

Example 15

The apparatus of Examples 9-14, wherein the calibration logic is to rotate the second PI clock phase and find a transition of 1 to 0 for the third sample, and record as code value E3.

Example 16

The apparatus of Examples 9-15, wherein the calibration logic is to rotate the third PI clock phase and find a transition of 1 to 0 for the fourth sample, and record as code value E4.

Example 17

The apparatus of Examples 9-16, wherein the calibration logic is to find a difference between the code values E3 and E4 indicating a skew in the clock.

Example 18

The apparatus of Examples 9-17, wherein the apparatus comprises of a PI Offset logic, wherein the PI-Offset logic applies the E3 and E4 code difference to adjust the clock and to compensate for the skew.

Example 19

The apparatus of Examples 9-18, wherein the first, second and third PI are coupled respectively to a first, second and third buffers, wherein the buffers are clock trees used for receiver data sampling.

Example 20

The apparatus of Examples 9-19, wherein the first, second and third PI are coupled to a PI Finite State Machine (PI-FSM), wherein the PI-FSM is to provide a setting to generate and control a Voltage/Temperature (VT) tracking clock.

Example 21

In one example, a system is provided comprising: a memory; a processor coupled to the memory, wherein the processor comprises: a receiver to receive a differential clock; a delay locked loop (DLL) coupled to the receiver; a first phase interpolator (PI) coupled to the DLL, the first PI to provide a first clock phase; a second PI coupled to the DLL, wherein the second PI is to provide a second or third clock phase; circuitry to adjust the first and second PIs according to the first clock phase, and the second or third clock phase.

Example 22

The system of Example 21, wherein the first PI is an error PI, and wherein the second PI is an even PI.

Example 23

The system of Examples 21-22, wherein the system further comprises a third PI coupled to the DLL, wherein the third PI is to provide a fourth clock phase.

Example 24

The system of Examples 21-23, wherein the third PI is an odd PI.

Example 25

The system of Examples 21-24, wherein the first, second and third PI are coupled respectively to a first, second and third buffers, wherein the buffers are clock trees used for receiver data sampling.

Example 26

The system of Examples 21-25, wherein the first, second and third PI are coupled to a PI Finite State Machine (PI-FSM), wherein the PI-FSM is to provide a setting to generate and control a Voltage/Temperature (VT) tracking clock.

Example 27

The system of Examples 21-26, wherein the system further comprises a first clock distribution network and a second clock distribution network, wherein the first distribution network is to receive the second clock phase, wherein the second distribution network is to receive a third clock phase, wherein the first, second and third PI are coupled to a second circuitry, wherein the second circuitry is to provide skew between first and second clock distribution networks.

Example 28

The system of Examples 21-27, wherein the first, second, and third clock phases are at least one of: substantially 0, 90, and 270 degree clock phases, respectively; or substantially 0, 180, and 270 degree clock phases, respectively.

Example 29

In another example, a system is provided comprising: a memory; a processor coupled to the memory, wherein the processor comprises: a receiver to receive a differential clock; a delay locked loop (DLL) coupled to the receiver; a first phase interpolator (PI) coupled to the DLL, wherein the first PI is to provide a substantially zero clock phase; a second PI coupled to the DLL, wherein the second PI is to provide a substantially 180 degree clock phase; and a calibration logic to select the zero clock phase for sampling a first edge of a clock, and to record a first sample; wherein the calibration logic is to select the 180 degree clock phase to sample another edge of the clock and to record a second sample; and wherein the calibration logic is to determine a rotated clock phase based on the first and second samples.

Example 30

The system of Example 29, wherein the calibration logic is to rotate the first PI clock phase and find a transition of 0 to 1 for the first sample and to record as code value E1 and to rotate the second PI clock phase and find a transition of 1 to 0 for the second sample and record as code value E2.

Example 31

The system of Examples 29-30, wherein the calibration logic is to rotate the first PI clock phase and find a transition of 1 to 0 for the first sample and to record as code value E1 and to rotate the second PI clock phase and find a transition of 0 to 1 for the second sample and record as code value E2.

Example 32

The system of Examples 29-31, wherein the calibration logic is to determine a 90 degree clock phase from calculating: (E1+(E1+E2)*0.5).

Example 33

The system of Examples 29-32, wherein the calibration logic to determine a 270 degree clock phase from calculating: (E1−(E1+E2)*0.5).

Example 34

The system of Examples 29-33, wherein the system further comprises a third PI coupled to the DLL, wherein the third PI is to provide a 270 degree clock phase.

Example 35

The system of Examples 29-34, wherein the calibration logic is to rotate the second PI clock phase and find a transition of 1 to 0 for the third sample, and record as code value E3.

Example 36

The system of Examples 29-35, wherein the calibration logic is to rotate the third PI clock phase and find a transition of 1 to 0 for the fourth sample, and record as code value E4.

Example 37

The system of Examples 29-36, wherein the calibration logic is to find a difference between the code values E3 and E4 indicating a skew in the clock.

Example 38

The system of Examples 29-37, wherein the apparatus comprises of a PI Offset logic, wherein the PI-Offset logic applies the E3 and E4 code difference to adjust the clock and to compensate for the skew.

Example 39

The system of Examples 29-38, wherein the first, second and third PI are coupled respectively to a first, second and third buffers, wherein the buffers are clock trees used for receiver data sampling.

Example 40

The system of Examples 29-39, wherein the first, second and third PI are coupled to a PI Finite State Machine (PI-FSM), wherein the PI-FSM is to provide a setting to generate and control a Voltage/Temperature (VT) tracking clock.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a receiver to receive a differential clock;
a delay locked loop (DLL) coupled to the receiver;
a first phase interpolator (PI) coupled to the DLL, the first PI to provide a first clock phase;
a second PI coupled to the DLL, wherein the second PI is to provide a second or third clock phase; and
circuitry to adjust the first and second PIs in accordance with the first clock phase, and the second or third clock phase.

2. The apparatus of claim 1, wherein the first PI is an error PI, and wherein the second PI is an even PI.

3. The apparatus of claim 1, further comprising a third PI coupled to the DLL, wherein the third PI is to provide a fourth clock phase, and further wherein the third PI is an odd PI.

4. The apparatus of claim 3, wherein the first, second and third PIs are coupled respectively to a first, second and third buffers, wherein the buffers are clock trees, and wherein the buffers are to sample receiver data.

5. The apparatus of claim 3, wherein the first, second and third PIs are coupled to a PI Finite State Machine (PI-FSM), and wherein the PI-FSM is to provide a setting to generate and control a Voltage or Temperature (VT) trackable clock.

6. The apparatus of claim 3, further comprising a first clock distribution network and a second clock distribution network, wherein the first distribution network is to receive the second clock phase, wherein the second distribution network is to receive a third clock phase, and wherein the first, second and third PIs are coupled to a second circuitry, and wherein the second circuitry is to provide skew between first and second clock distribution networks.

7. The apparatus of claim 1, wherein the first, second, and third clock phases are at least one of:
substantially 0, 180, and 270 degree clock phases, respectively; or
substantially 0, 90, and 270 degree clock phases, respectively.

8. An apparatus comprising:
a receiver to receive a differential clock;
a delay locked loop (DLL) coupled to the receiver;
a first phase interpolator (PI) coupled to the DLL, wherein the first PI is to provide a substantially zero clock phase;
a second PI coupled to the DLL, wherein the second PI is to provide a substantially 180 degree clock phase; and
a calibration logic to select the substantially zero clock phase to sample a first edge of a clock, and to record a first sample;
wherein the calibration logic is to select the substantially 180 degree clock phase to sample a second edge of the differential clock and to record a second sample; and
wherein the calibration logic is to determine a rotated clock phase based on the first and second samples.

9. The apparatus of claim 8, wherein the calibration logic is to rotate the substantially zero clock phase from the first PI and find a transition of 0 to 1 for the first sample and to record as code value E1, and wherein the calibration logic is to rotate the substantially 180 degree clock phase from the second PI and find a transition of 1 to 0 for the second sample and record as code value E2.

10. The apparatus of claim 9, wherein the calibration logic is to determine a substantially 90 degree clock phase with (E1+(E1+E2)*0.5), and wherein the calibration logic is to determine a substantially 270 degree clock phase with (E1−(E1+E2)*0.5).

11. The apparatus of claim 8, wherein the calibration logic is to rotate the substantially zero clock phase from the first PI and is to find a transition of 1 to 0 for the first sample and to record as code value E1, and wherein the calibration logic is to rotate the substantially 180 degree clock phase from the second PI and find a transition of 0 to 1 for the second sample and record as code value E2.

12. The apparatus of claim 8, further comprising a third PI coupled to the DLL, wherein the third PI is to provide a substantially 270 degree clock phase.

13. The apparatus of claim 12, wherein the first, second and third PIs are coupled respectively to a first, second and third buffers, wherein the first, second, and third buffers comprise clock trees, and wherein the first, second, and third buffers are used to sample receiver data.

14. The apparatus of claim 12, wherein the first, second and third PIs are coupled to a PI Finite State Machine (PI-FSM), and wherein the PI-FSM is to provide a setting to generate and control a Voltage or Temperature (VT) trackable clock.

15. The apparatus of claim 12, wherein the calibration logic is to rotate the substantially 180 degree clock phase from the second PI and find a transition of 1 to 0 for a third sample, and record as code value E3.

16. The apparatus of claim 15, wherein the calibration logic is to rotate the substantially 270 degree clock phase from the third PI and is to identify a transition of 1 to 0 for a fourth sample, and record as code value E4.

17. The apparatus of claim 16, wherein the calibration logic is to identify a difference between the code values E3 and E4, wherein the difference is to indicate a skew in the clock.

18. The apparatus of claim 17, further comprising a PI Offset logic, wherein the PI Offset logic is to apply the E3 and E4 code difference to adjust the clock and to compensate for the skew.

19. A system comprising:
   a memory;
   a processor coupled to the memory; and
   a wireless interface to allow the processor to communicate with another device, wherein the processor comprises:
      a receiver to receive a differential clock;
      a delay locked loop (DLL) coupled to the receiver;
      a first phase interpolator (PI) coupled to the DLL, the first PI to provide a first clock phase;
      a second PI coupled to the DLL, wherein the second PI is to provide a second or third clock phase; and
      circuitry to adjust the first and second PIs according to the first clock phase, and the second or third clock phase.

20. The system of claim 19, wherein the first PI is an error PI, and wherein the second PI is an even PI.

* * * * *